United States Patent
Hsiao et al.

(10) Patent No.: US 7,791,080 B2
(45) Date of Patent: Sep. 7, 2010

(54) IMAGE TFT ARRAY OF A DIRECT X-RAY IMAGE SENSOR AND METHOD OF FABRICATING THE SAME

(75) Inventors: Chian-Chih Hsiao, Taipei Hsien (TW); Chih-Chieh Lan, Taipei (TW)

(73) Assignee: HannStar Display Corp., Neihu District, Taipei (TW)

( * ) Notice: Subject to any disclaimer, the term of this patent is extended or adjusted under 35 U.S.C. 154(b) by 5 days.

(21) Appl. No.: 12/251,430

(22) Filed: Oct. 14, 2008

(65) Prior Publication Data

US 2009/0032892 A1 Feb. 5, 2009

Related U.S. Application Data

(62) Division of application No. 11/164,402, filed on Nov. 21, 2005, now Pat. No. 7,452,782.

(51) Int. Cl.
*H01L 29/04* (2006.01)
(52) U.S. Cl. .................. 257/72; 257/59; 257/E27.111
(58) Field of Classification Search .................. 257/59, 257/72, 431, E27.131, E27.111
See application file for complete search history.

(56) References Cited

U.S. PATENT DOCUMENTS

| 2002/0048866 A1* | 4/2002 | Wong ........................ 438/155 |
| 2003/0038241 A1* | 2/2003 | Choo et al. ............ 250/370.09 |
| 2005/0263769 A1* | 12/2005 | Chul Ahn .................... 257/72 |
| 2006/0108587 A1* | 5/2006 | Lee et al. ..................... 257/72 |

\* cited by examiner

*Primary Examiner*—Evan Pert
*Assistant Examiner*—Selim Ahmed
(74) *Attorney, Agent, or Firm*—Winston Hsu

(57) ABSTRACT

A method of fabricating an image TFT array of a direct X-ray image sensor includes forming a first transparent conductive layer on a substrate; forming a gate line including a gate electrode, a common line, and a common electrode jutting out from the common line; forming an insulation layer; forming a semiconducting island on the insulation layer in the transistor region; forming a first via hole for the common electrode; forming a data line and a source electrode and a drain electrode; forming a passivation layer and a second via hole penetrating the passivation layer for the source electrode; forming a second transparent conductive layer as a top electrode. The insulation layer is formed on the first transparent conductive layer to serve as a dielectric layer of a capacitor before the TFT structure formed and can be formed at a relatively high temperature.

10 Claims, 12 Drawing Sheets

US 7,791,080 B2

IMAGE TFT ARRAY OF A DIRECT X-RAY IMAGE SENSOR AND METHOD OF FABRICATING THE SAME

CROSS REFERENCE TO RELATED APPLICATIONS

This application claims priority from U.S. application Ser. No. 11/164,402 by Hsiao et al., filed Nov. 21, 2005, entitled "Image TFT array of a direct X-ray image sensor and method of fabricating the same".

BACKGROUND OF THE INVENTION

1. Field of the Invention

The present invention relates to an image TFT array. More particularly, the present invention relates to a method of fabricating an image TFT array of a direct X-ray image sensor and the image TFT array.

2. Description of the Prior Art

There have been proposed systems and methods for detection of static and/or dynamic X-ray images. These digital X-ray systems and methods provide digital representations of X-ray images in which the X-ray image is recorded as readable electrical signals, thus obviating the need for films and screen in the imaging process. Digital X-ray systems typically rely on direct conversion of X-rays to charge carriers or alternatively indirect conversion in which X-rays are converted to light which is then converted to charge carriers.

FIG. 1 shows a schematic cross sectional view of a direct conversion digital detector. Direct conversion approaches typically use an X-ray sensitive photoconductor 2 such as amorphous Se, Cd, Ta, and the like overlying a solid state element 4. The solid state element 4 comprises a solid state array having thin-film-transistors (TFTs) 6 coupled to storage capacitors 8. The photoconductor 2 generates electron-positive hole pairs (EHP) upon reception of energy, such as x-rays, incident through a top electrode 1. The positive holes accelerated by several thousand volts between the top electrode and the ground plane of the TFT array are collected by charge collection electrodes (CCE) 3 which charge storage capacitors 8. When the gate channel 7 of TFT 6 is open, discharging currents flow through the channel and the charges are converted directly into the digital signal by the external read out circuit connected to the end of the data line 5.

In FIG. 2, a top view of an image TFT array for a direct X-ray image sensor is shown. FIG. 3 is a sectional view taken along line A-A' and line B-B' of FIG. 2. As shown in FIGS. 2 and 3, each pixel of the prior art includes a substrate 10, a gate line 12, a gate electrode being a part of the gate line, an insulation layer 14, an island structure 16, a drain electrode 18, a source electrode 20, a data line 13 connecting the drain electrode 18, a common line 22, a passivation layer 24, a bottom electrode (a pixel electrode) 30, an insulation layer 32, and a top electrode (a charge collector electrode) 36. The source electrode 20 is electrically connected to the top electrode 36 through a via hole 26 by the bottom electrode 30. The common line 22 is connected to the bottom electrode 30 through a via hole 28 penetrating the passivation layer 24 on the common line 22.

The method for fabricating the above image TFT array includes seven steps of photolithography and etching. That is, the conventional method requires seven masks. The first photolithography step defines the gate line 12 including the gate electrode. And then an insulation layer 14 is deposited on the substrate 10 and the gate line 12 and the second photolithography step is performed to define the island structure 16. After the third photolithography step defines the common line 22, the source electrode 20, the drain electrode 18, and the data line 13, an passivation layer 24 is deposited and the fourth photolithography step is performed to define the via holes 26 and 28 simultaneously, as well as to remove the passivation layer 24 on the source pad of the data line 13, and remove the passivation layer 24 and the insulation layer 14 on the gate pad of the gate line 12. The source pad and the gate pad are positioned in the periphery of the pixel area for electrically connecting the driver ICs. Since the removals are performed in one step and the passivation layer 24 on the source pad is thinner than the total of the passivation layer 24 and the insulation layer 14 on the gate pad, the metal layer of the source pad of the data line is easily over etched. Especially when a Mo/Al/Mo (molybdenum/aluminum/molybdenum) layer is used as the second metal layer, the top Mo layer suffers from serious loss. And the fifth photolithography step defines the bottom electrode (the pixel electrode) 30 and fills the same material in the via hole 26. Then, a capacitor insulation layer 32 is formed and the sixth photolithography step defines the via hole 34. Finally, the seventh photolithography step defines the top electrode (the charge collector electrode) 36, as shown in FIG. 3.

In the above conventional method, the capacitor insulation layer, such as $SiN_x$, must be formed at a relatively low temperature to avoid the damage of the TFT structure which has already been formed. Thus, the resulting $SiN_x$ layer has an inferior quality for serving as a dielectric layer in a capacitor, in addition to the problem of over etching mentioned above.

SUMMARY OF THE INVENTION

An object of the present invention is to provide a novel method of fabricating an image TFT array of a direct X-ray image sensor and a novel structure of the image TFT array, in which the dielectric layer of the storage capacitor can be formed at a relatively high temperature to have a better quality. Furthermore, the over etching problem is avoided for preparing the gate pad and source pad.

In order to achieve these objects, the present invention provides a novel method of fabricating an image TFT array.

A substrate having a capacitor region and a transistor region is provided. A first transparent conductive layer is formed on the substrate in the capacitor region. A gate line and a common line is formed to extend transversely on the substrate in a same direction, wherein the gate line includes a gate electrode in the transistor region and the common line includes a common electrode jutting out from the common line on the substrate. An insulation layer is formed on the gate line, the gate electrode, the first transparent conductive layer, the common line, the common electrode, and the substrate. A semiconducting island is formed on the insulation layer in the transistor region. A first via hole is formed to penetrate the insulation layer to expose a part of a surface of the common electrode. A data line is formed to extend longitudinally on the insulation layer, and a source electrode and a drain electrode are formed on the semiconducting island to form a thin film transistor (TFT) structure, wherein the source electrode electrically connects the data line. A passivation layer is formed on the transistors, the gate line, the data line, the common line, and the part surface of the common electrode in the first via hole, and a second via hole is formed to penetrate the passivation layer to expose a part of a surface of the source electrode, and the passivation layer is removed on the part surface of the common electrode to expose the part of the common electrode in the first via hole. A second transparent conductive layer is formed in the transistor region and the capacitor region, wherein the second transparent conductive layer of the transistor region is electrically connected to the source electrode, and the second transparent conductive layer of the capacitor region overlaps the first transparent conductive layer for forming storage capacitor.

The present invention also provides a novel image TFT array of a direct X-ray image sensor, comprises: a substrate having a capacitor region and a transistor region; a storage capacitor in the capacitor region comprising: a first transparent conductive layer on the substrate, an insulation layer on the first transparent conductive layer, and a second transparent conductive layer on the insulation layer; a thin film transistor in the transistor region comprising: a first metal layer, the insulation layer extending from the capacitor region, an island structure on the insulation layer, a second metal layer as a source/drain electrode on the island structure, a passivation layer on the source/drain electrode and covering the transistor region, and a third transparent conductive layer on the passivation layer and covering a channel region between the source electrode and the drain electrode; and a common line comprising the first metal layer, wherein the common line extends transversely on the first transparent conductive layer and the substrate and is covered by the insulation layer.

Since the dielectric layer for the storage capacitor is formed before the TFT formation, the temperature for forming the dielectric layer, such as $SiN_x$, may be relatively high. Furthermore, in the step of removing the passivation layer on the source pad and the gate pad of the data line and the gate line in the peripheral layout, the thickness of layers to be removed is approximately the same, because the insulation layer formed on the gate line has been previously removed, thus an over etching problem is avoided.

Furthermore, a step of forming a semiconducting island or a channel between the source electrode and the drain electrode and a first via hole exposing the surface of the common electrode through the same photolithographic and etching process is used. Thus, the seven steps of photolithography process of an image TFT array of a direct X-ray image sensor could be reduced to six or less without over etching.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
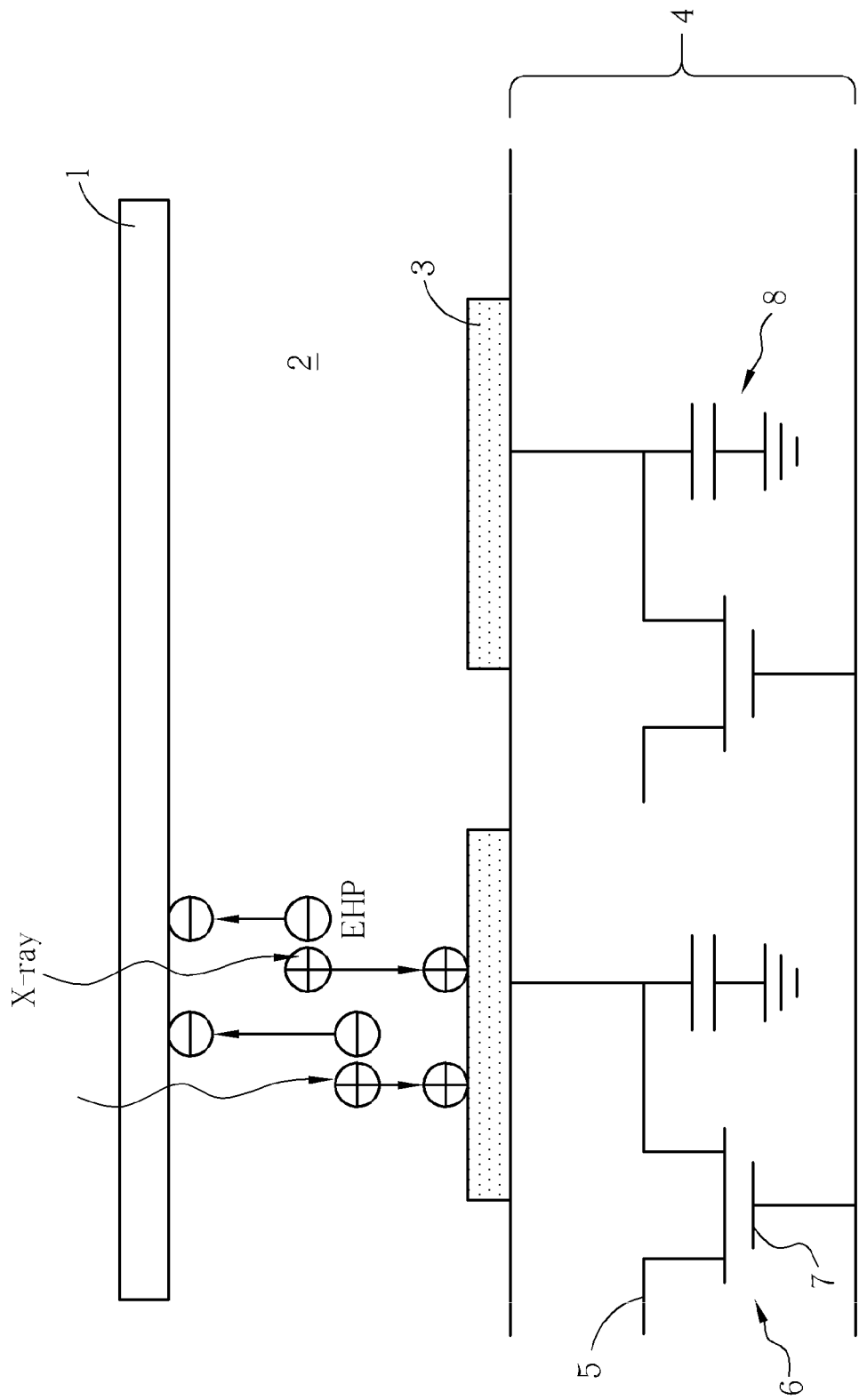
FIG. 1 shows a schematic cross sectional view of a direct conversion digital detector.
Figure 2:
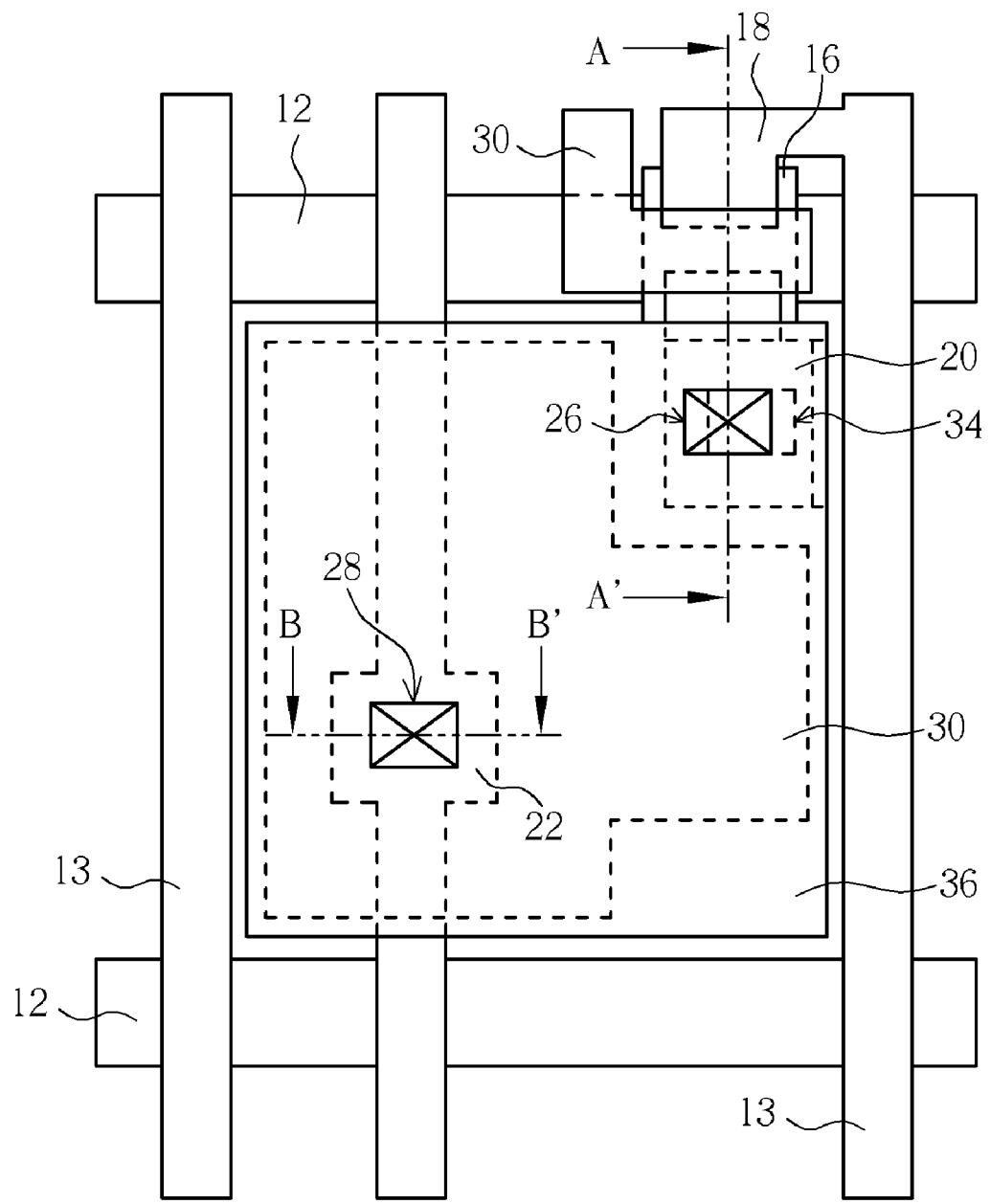
FIG. 2 is a schematic top view of a conventional image TFT array of a direct X-ray image sensor.
Figure 3:
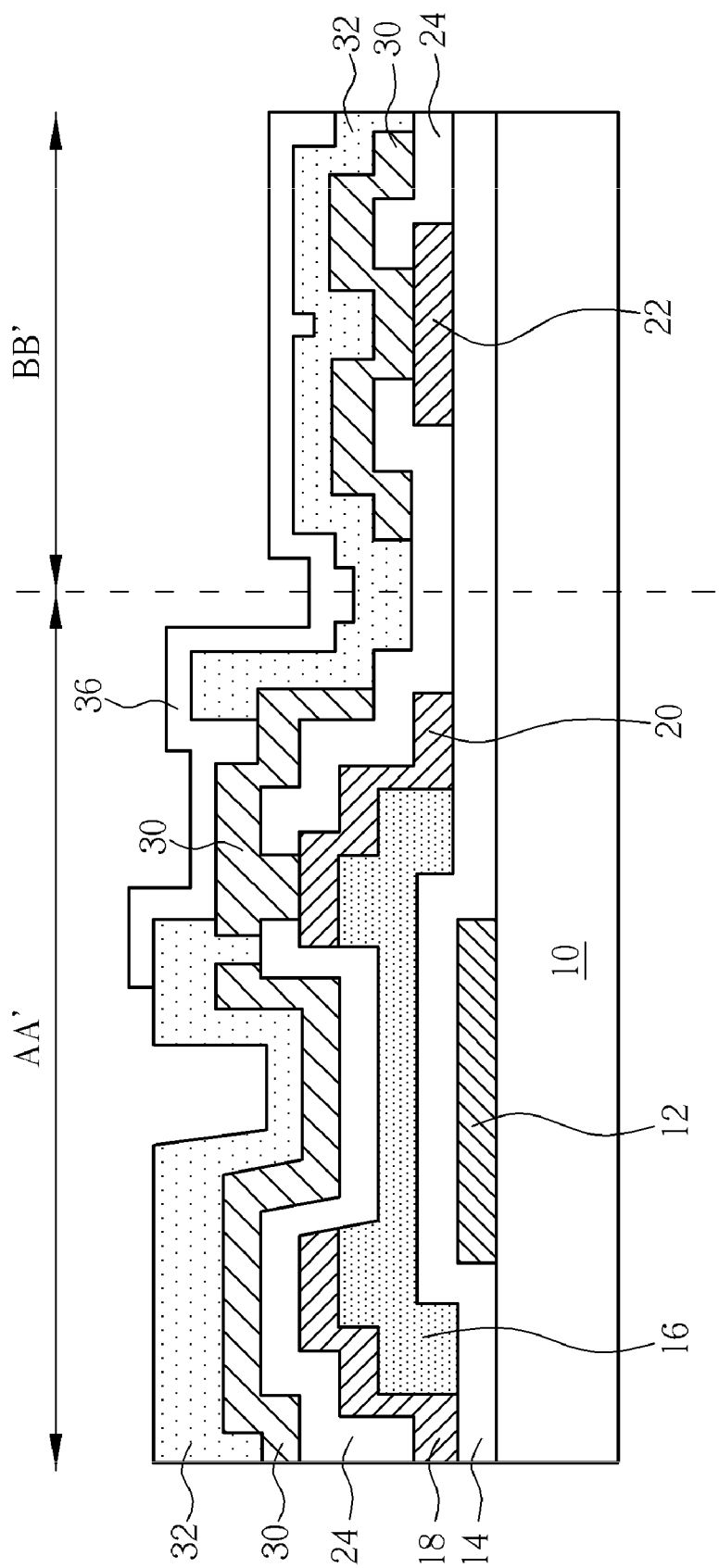
FIG. 3 is a schematic sectional view taken along line A-A' and line B-B' of FIG. 2.
Figure 4:
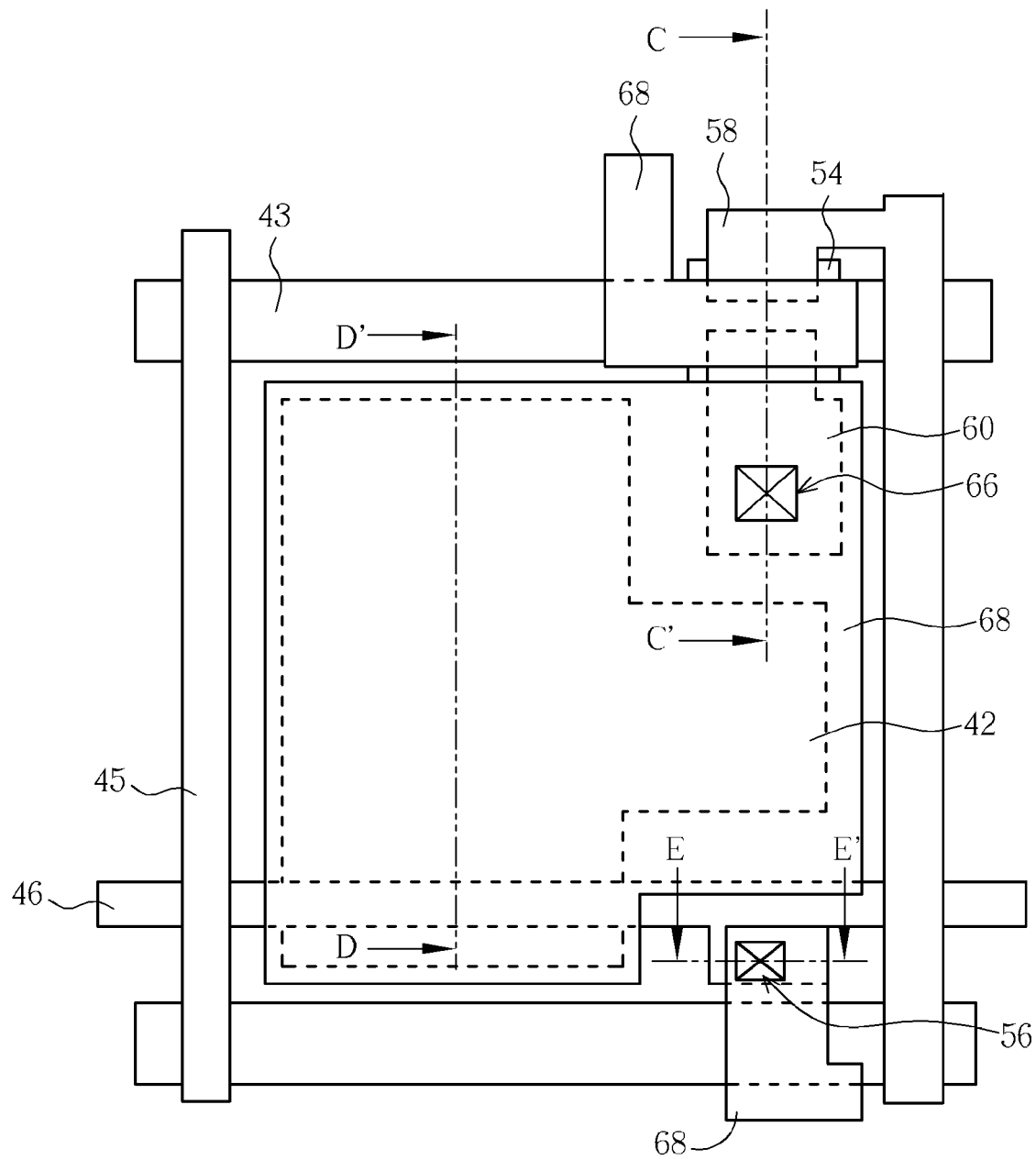
FIG. 4 is a schematic top view of an image TFT array of a direct X-ray image sensor according to the present invention.
Figure 5:
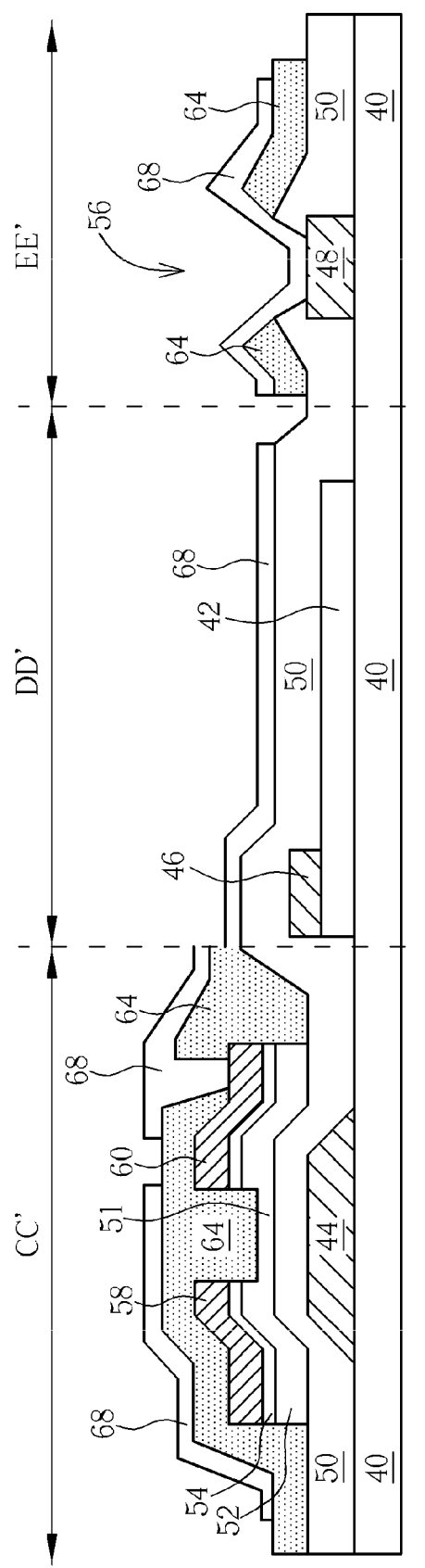
FIG. 5 is a schematic sectional view taken along lines C-C', D-D' and E-E' of FIG. 4.

FIG. 4 is a schematic top view of an image TFT array of a direct X-ray image sensor according to the present invention. FIG. 5 is a schematic sectional view taken along lines C-C', D-D' and E-E' of FIG. 4. FIGS. 6-11 are sectional views taken along lines C-C', D-D' and E-E' of FIG. 4 to show the manufacturing method according to the present invention.

As shown in FIGS. 4 and 5, a substrate 40 has a capacitor region for a storage capacitor and a transistor region for a TFT structure. A storage capacitor structure comprises a first transparent conductive layer 42 on the substrate 40, an insulation layer 50 serving as a dielectric layer on the first transparent conductive layer 42, and a second transparent conductive layer 68 on the insulation layer 50. The TFT structure comprises a first metal layer as a gate electrode 44, the insulation layer 50 over the gate electrode 44 and the substrate 40, an island structure on the insulation layer 50, and a second metal layer as a source electrode 60 and a drain electrode 58 on the island structure. The island structure comprises a semiconductor layer 52 on the insulation layer 50 and a doped semiconductor layer 54 on the semiconductor layer 52 as a semiconducting island. A passivation layer 64 may be further positioned on the source electrode 60 and the drain electrode 58. A portion of the second transparent conductive layer 68 is on the passivation layer 64 above the TFT, through an opening in the passivation layer 64 to contact with the source electrode 60. Another portion of the second transparent conductive layer 68 is on the passivation layer 64 and covers a channel region 51 between the source electrode 60 and the drain electrode 58.

A gate line 43 includes the gate electrode 44 in the transistor region. A common line 46 covered by the insulation layer 50 extends transversely on the first transparent conductive layer 42 and the substrate 40. In the other hand, the direction of the common line 46 is the same as the direction of the gate line 43. Besides, a common electrode 48 is an extension portion of the common line 46 and also covered by the insulation layer 50. And the second transparent conductive layer is electrically connected to the common electrode 48 through a via hole 56 of the insulation layer 50. A data line 45 is formed on the insulation layer 50 and comprises a connection portion as the drain electrode 58 of the TFT structure.

Figure 6:
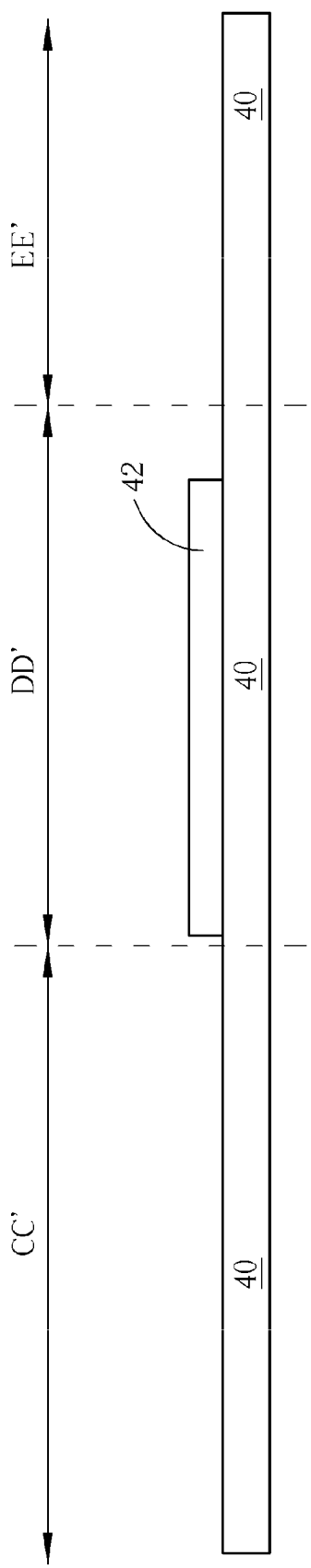
FIGS. 6-11 are sectional views taken along lines C-C', D-D' and E-E' of FIG. 4 to show the manufacturing method according to the present invention.

FIGS. 6-11 are sectional views taken along lines C-C', D-D' and E-E' of FIG. 4 to show the manufacturing method according to the present invention. As shown in FIG. 6, first, a substrate 40 such as a glass substrate is provided. A capacitor region and a transistor region are predetermined on the substrate 40. A first transparent conductive layer 42 is formed by deposition of a conductive layer, followed by a first photolithographic and etching process on the substrate 40 in the capacitor area. The first transparent conductive layer 42 serves as a bottom electrode or a pixel electrode. And a wet etching process is preferably adopted.

Figure 7:
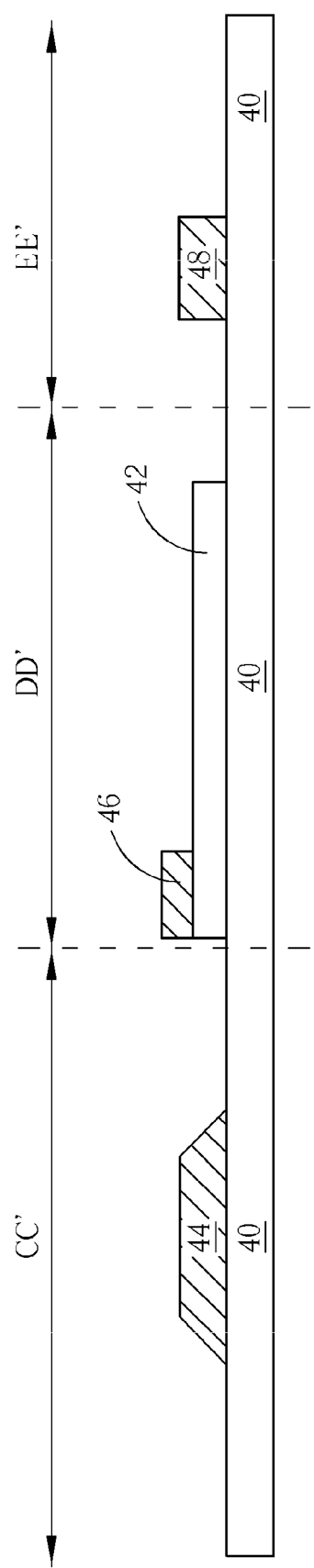

As shown in FIG. 7, a first metal layer is deposited and defined using a second photolithographic and etching process to form a gate line 43 including a gate electrode 44 and a common line 46 extending transversely on the first transparent conductive layer 42 and the substrate 40 in a same direction. Furthermore, a gate pad and a common electrode 48 jutting out from the common line 46 on the substrate 40 are also formed by the same photolithographic and etching process. In the other word, the gate line, the gate electrode, the common line, the common electrode, and the pad are defined simultaneously. Although the etching process could be dry etching or wet etching, a wet etching process is preferred.

Figure 8:
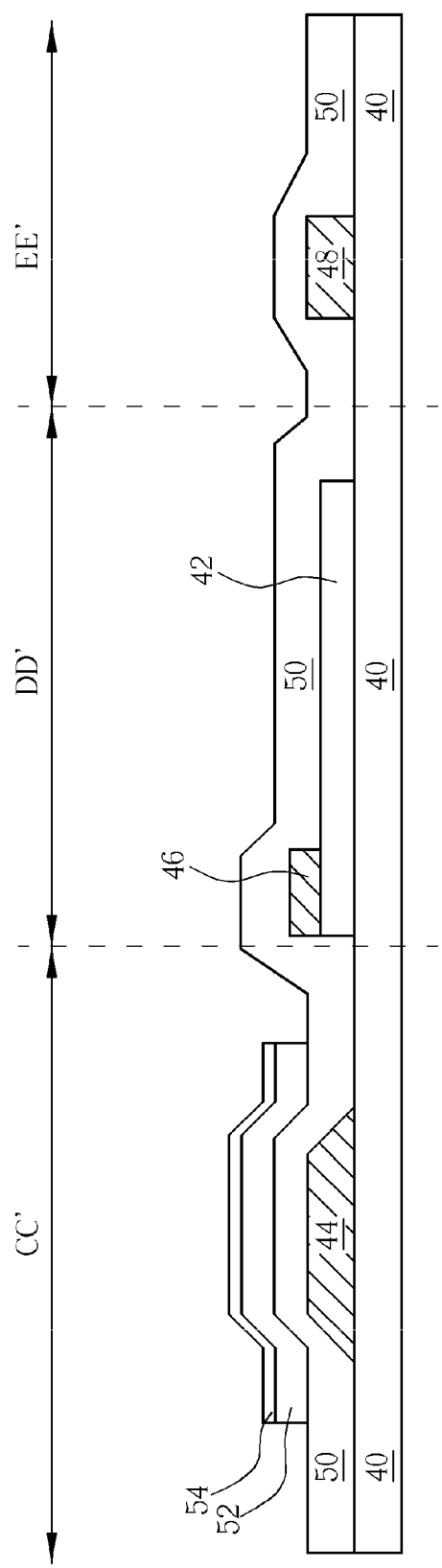

As shown in FIG. 8, an insulation layer 50 is formed on the gate line 43, the gate electrode 44, the first transparent conductive layer 42, the common line 46, the common electrode 48, the gate pad, and the substrate 40. Thus, the insulation layer 50 is also formed on the first transparent conductive layer 42 for serving as a dielectric layer of the storage capacitor. The insulation layer 50 can be formed at a relatively high temperature to enhance the properties as a dielectric layer, and the TFT structure will not be affected because the TFT array structure has not been formed yet. Thus, the resulting storage capacitor has a relatively high capacitance and insulating breakdown voltage. And the insulation layer 50 may be a layer of one selected from the group consisting of silicon oxide, silicon nitride, stack layers thereof, or a layer of a mixture thereof. For example, $SiO_2$, $SiN_x$, or SiON is used generally.

Next, a semiconducting island is formed on the insulation layer 50 in the transistor region by a third photolithographic and etching process. The island may be formed by depositing a semiconductor layer 52 such as amorphous silicon layer and a doped semiconductor layer 54 such as doped amorphous silicon layer (e.g. $n^+$ a-Si) on the insulation layer 50. Next, the photolithographic and etching process, preferably with a dry etching process is performed to etch part of the doped semiconductor layer and the semiconductor layer, forming a semiconducting island on the insulation layer 50 in the transistor region.

Figure 9:
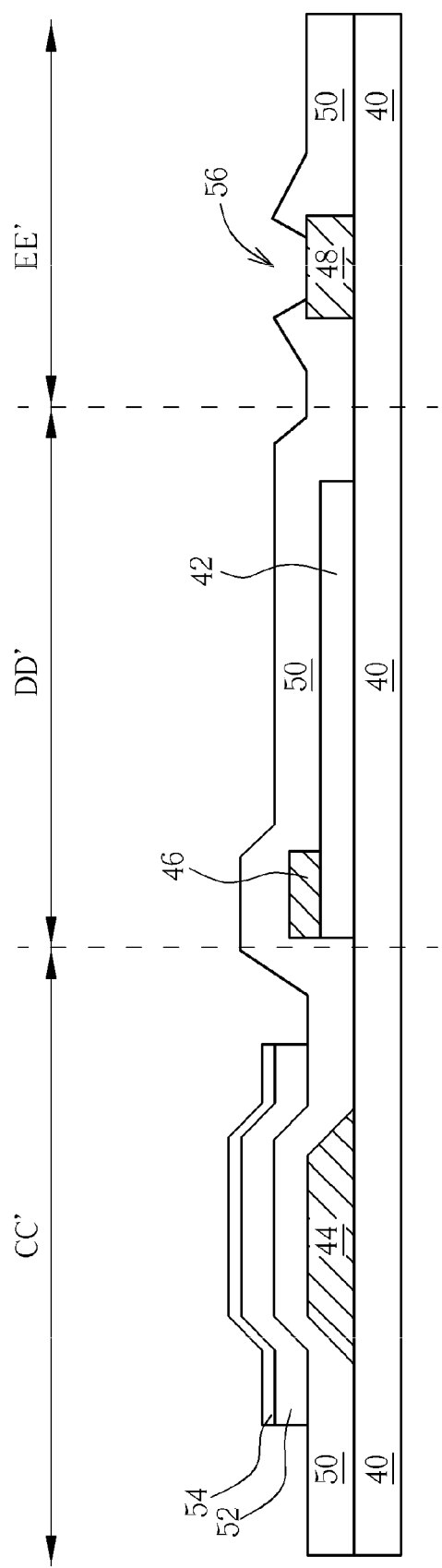

As shown in FIG. 9, a first via hole 56 is formed by a fourth photolithographic and etching process to penetrate the insulation layer 50 to expose a part of a surface of the common electrode 48. In the same step, the insulation layer 50 formed on a gate pad on the outer portion of the array panel can be removed using the same photolithographic and etching process. That is, the insulation layer 50 on the gate pad and the common electrode 48 is removed simultaneously. Although the etching process could be dry etching or wet etching, a dry etching process is preferred.

In another embodiment, the insulation layer 50, the semiconductor layer 52, and the doped semiconductor layer 54 may be formed successively. Thereafter, the semiconducting island and the first via hole 56 are formed simultaneously by a photolithographic and etching process using a photoresist layer which is patterned by utilizing a half-tone mask or a slit-pattern mask to have at least three various thicknesses as desired.

Figure 10:
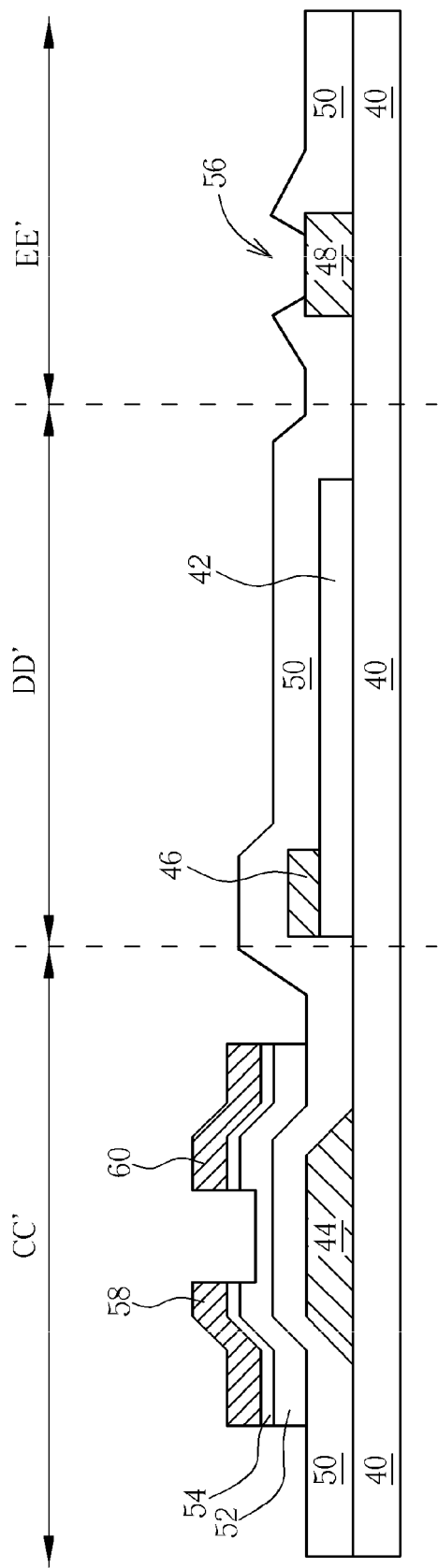

As shown in FIG. 10, a second metal layer is deposited and defined by a fifth photolithographic and etching process, preferably with a wet etching process to form a data line extending longitudinally on the insulation layer 50. Next, a source electrode 60 and a drain electrode 58 on the semiconducting island are further formed with a channel to form a thin film transistor (TFT) structure by a dry etching process. The drain electrode 58 electrically connects the data line 45. The first and second metal layer may each comprise a layer of metal selected from Ag, Au, Al, Cu, Mo, Ti, Pt, Ir, Ni and Cr, stack layers thereof or a layer of a mixture thereof.

Furthermore, the first via hole 56 and the channel of the source electrode and the drain electrode may be simultaneously formed just by same etching process after the second metal layer is patterned.

Figure 11:
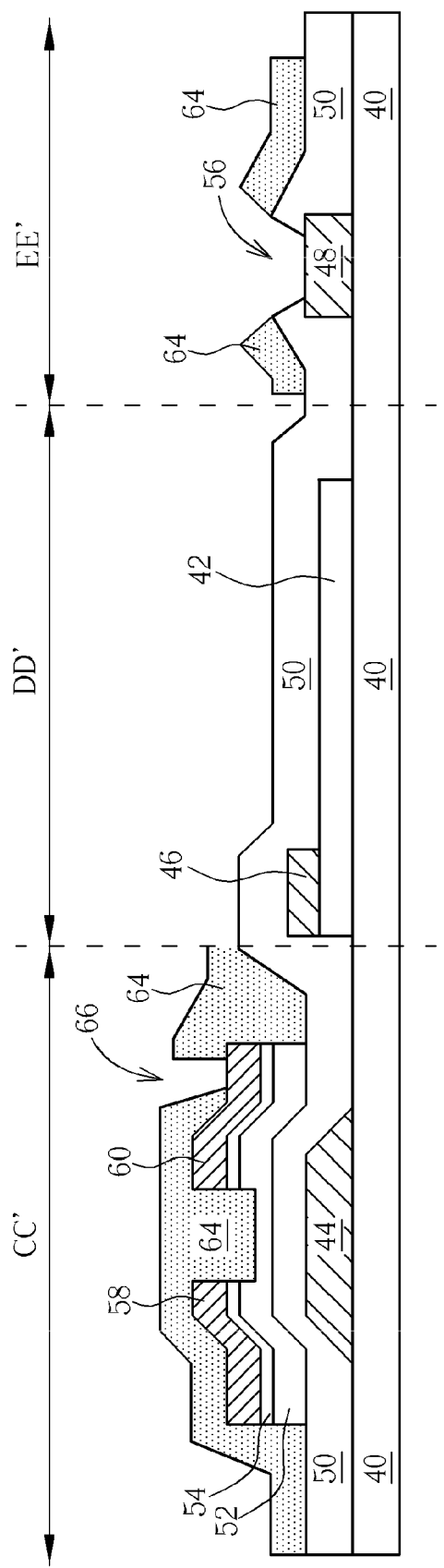
Figure 12:
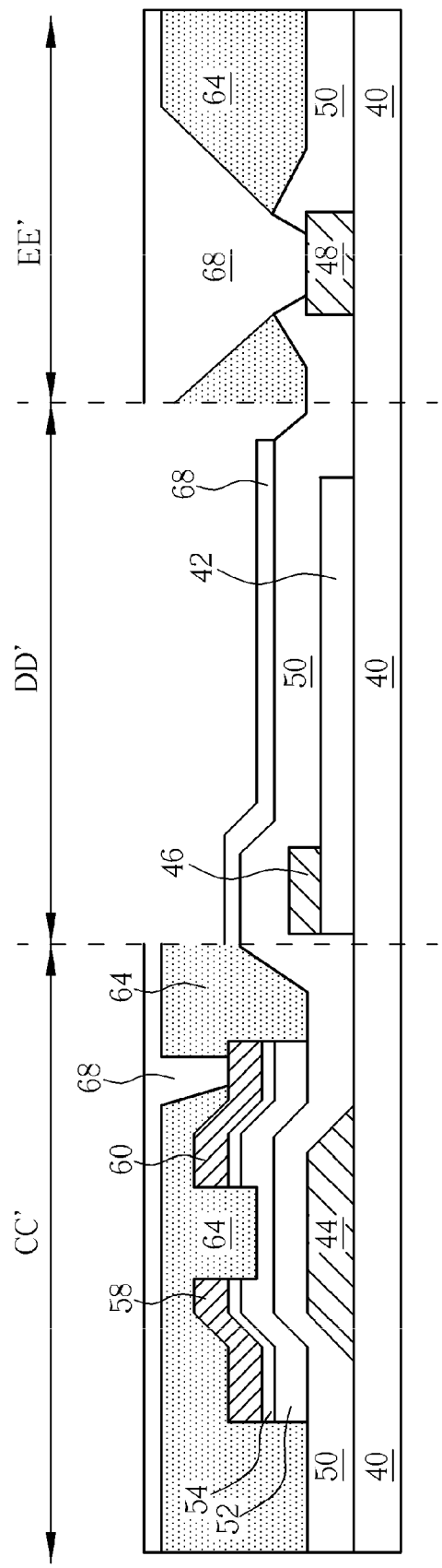
FIG. 12 is a schematic sectional view of another embodiment according to the present invention.

As shown in FIG. 11, a passivation layer 64 is deposited by, for example, CVD on the transistors, the gate line, the data line, the common line, the part surface of the common electrode in the first via hole, and the source pad of the data line 45 (the second metal) and the gate pad of the gate line 44 (the first metal) (not shown). Next, a second via hole 66 is formed by a sixth photolithographic and etching process to penetrate the passivation layer 64 to expose a part of a surface of the source electrode 60. The passivation layer on the part surface of the common electrode 48 is also removed to expose the part of the common electrode 48 in the first via hole 56. In this step, the passivation layer 64 formed on the source pad of the data line 45 (the second metal) and the gate pad of the gate line 44 (the first metal) are removed simultaneously by the photolithographic and etching process. The etching process is preferably a dry etching process. Because the insulation layer 50 on the first metal layer has been removed previously, only the passivation layer 64 on the first metal layer may be etched as with that on the second metal layer of the source pad. Thus, the over etching problem to the source pad is avoided. And the passivation layer 64 comprised a layer of one selected from the group consisting of silicon oxide, silicon nitride, stack layers thereof, or a layer of a mixture thereof. Excepted, referring to FIG. 12, the passivation layer 64 also can be as a planarization layer formed of an organic layer, such as benzocyclobutene (BCB), perfluorocyclobutane (PFCB), fluorinated para-xylene, acrylic resin, or color resin and so on that provides a planar surface of the previous structure.

Finally, a second transparent conductive layer 68 is conformally formed on the passivation layer in the transistor region, the insulation layer in the capacitor region, an interior surrounding surface of the first via hole, and an interior surrounding surface of the second via hole and defined by a seventh photolithographic and etching process to serve as a top electrode or a charge collector electrode. Although the etching process could be dry etching or wet etching, wet etching process is preferred. The first and second transparent conductive layer may comprise a layer of indium tin oxide (ITO), indium zinc oxide (IZO), indium oxide, tin oxide, zinc oxide, aluminum zinc oxide (AZO), or tellurium oxide, stack layers thereof or a layer of a mixture. Thus, a storage capacitor structure comprising the first transparent conductive layer 42, the insulation layer 50 as a dielectric layer, and the second transparent conductive layer 68 is obtained, as shown in FIG. 5, forming an image TFT array of a direct X-ray image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image TFT array of a direct X-ray image sensor, comprising:
   a substrate having a capacitor region and a transistor region;
   a storage capacitor in the capacitor region comprising: a first transparent conductive layer on the substrate, a gate insulation layer on the first transparent conductive layer, and a second transparent conductive layer directly in contact with a top surface of the gate insulation layer;
   a thin film transistor in the transistor region comprising: a first metal layer, the gate insulation layer extending from the capacitor region, an island structure on the gate insulation layer, a second metal layer as a source/drain electrode on the island structure, a passivation layer bordering the source/drain electrode and covering the transistor region, and a third transparent conductive layer directly on a top surface of the passivation layer and covering a channel region between the source electrode and the drain electrode; and
   a common line comprising the first metal layer, wherein the common line extends transversely on the first transparent conductive layer and the substrate and is covered by the gate insulation layer.

2. The image TFT array according to claim 1, further comprising two gate lines extending substantially in parallel with the common line on the substrate, and a common electrode connecting the common line, wherein the common line is disposed between the two gate lines, and the common electrode is positioned on the substrate and covered by the gate insulation layer having a via hole that exposes a portion of the common electrode to contact with the second transparent conductive layer and the third transparent conductive layer.

3. The image TFT array according to claim 1, wherein the second transparent conductive layer is positioned on the passivation layer and contact with the source electrode through a via hole penetrating the passivation layer.

4. The image TFT array according to claim 1, wherein the first metal layer comprises a layer of one selected from the group consisting of Ag, Au, Al, Cu, Mo, Ti, Pt, Ir, Ni and Cr, stack layers thereof or a layer of a mixture thereof.

5. The image TFT array according to claim 1, wherein the gate insulation layer comprises a layer of one selected from the group consisting of silicon oxide, silicon nitride, stack layers thereof, or a layer of a mixture thereof.

6. The image TFT array according to claim 1, wherein the island structure comprises:
 an amorphous silicon layer on the gate insulation layer; and
 a doped amorphous silicon layer on the amorphous silicon layer;
 wherein, part of the doped amorphous silicon layer and part of the amorphous silicon layer are removed.

7. The image TFT array according to claim 1, wherein the first transparent conductive layer comprises a layer of one selected from the group consisting of indium tin oxide (ITO), indium zinc oxide (IZO), indium oxide, tin oxide, zinc oxide, aluminum zinc oxide (AZO), and tellurium oxide, stack layers thereof, or a layer of a mixture thereof, serving as one of a bottom electrode and a pixel electrode.

8. The image TFT array according to claim 3, wherein the passivation layer comprises a layer of one selected from the group consisting of silicon oxide, silicon nitride, stack layers thereof, or a layer of a mixture thereof.

9. The image TFT array according to claim 3, wherein the passivation layer is formed as a planarization layer of one organic layer including benzocyclobutene (BCB), perfluorocyclobutane (PFCB), fluorinated para-xylene, an acrylic resin, or a color resin.

10. The image TFT array according to claim 1, wherein the second transparent conductive layer comprises a layer of one selected from the group consisting of indium tin oxide (ITO), indium zinc oxide (IZO), indium oxide, tin oxide, zinc oxide, aluminum zinc oxide (AZO), and tellurium oxide, stack layers thereof, or a layer of a mixture thereof, serving as one of a top electrode and a charge collector electrode.

* * * * *